US010492315B2

(12) United States Patent
Zhai et al.

(10) Patent No.: US 10,492,315 B2
(45) Date of Patent: Nov. 26, 2019

(54) STORAGE DEVICE CARRIER SYSTEM

(71) Applicant: EMC IP Holding Company, LLC, Hopkinton, MA (US)

(72) Inventors: Haifang Zhai, Shanghai (CN); Yujie Zhou, Shanghai (CN); Xiaoping Wu, Shanghai (CN); Wei Dong, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/044,674

(22) Filed: Jul. 25, 2018

(65) Prior Publication Data

US 2019/0037713 A1 Jan. 31, 2019

(30) Foreign Application Priority Data

Jul. 27, 2017 (CN) .......................... 2017 1 0624429

(51) Int. Cl.
| | |
|---|---|
| *H05K 5/02* | (2006.01) |
| *H05K 7/14* | (2006.01) |
| *G11B 33/14* | (2006.01) |
| *H05K 7/20* | (2006.01) |
| *G06F 1/20* | (2006.01) |
| *G11B 33/12* | (2006.01) |

(52) U.S. Cl.
CPC ............ *H05K 5/0213* (2013.01); *G06F 1/20* (2013.01); *G11B 33/128* (2013.01); *G11B 33/1406* (2013.01); *H05K 5/0221* (2013.01); *H05K 7/1488* (2013.01); *H05K 7/20736* (2013.01); *H05K 7/20836* (2013.01)

(58) Field of Classification Search
CPC .. H05K 5/0213; H05K 5/0221; H05K 7/1488; H05K 7/20836; H05K 5/0021; H05K 7/20736; H05K 7/20727; H05K 7/023; H05K 7/026; G06F 1/20; G06F 1/187; G06F 11/201; G11B 33/1406; G11B 33/128; G11B 33/125
See application file for complete search history.

(56) References Cited

U.S. PATENT DOCUMENTS

| | | | | |
|---|---|---|---|---|
| 6,141,211 A | * | 10/2000 | Strickler | ................. G06F 1/184 361/679.31 |
| 7,167,368 B2 | * | 1/2007 | Ya | ........................... G06F 1/181 165/121 |
| 7,715,188 B2 | * | 5/2010 | Matsushima | ........ G11B 33/142 165/122 |
| 9,055,691 B2 | * | 6/2015 | Doglio | ................. H05K 7/1489 |
| 9,851,764 B2 | * | 12/2017 | Harvilchuck | ........... G06F 1/185 |
| 2006/0261015 A1 | * | 11/2006 | Blackwell | ............ H05K 5/0021 211/26 |

(Continued)

*Primary Examiner* — James Wu
*Assistant Examiner* — Hung Q Dang
(74) *Attorney, Agent, or Firm* — Brian J. Colandreo; Mark H. Whittenberger; Holland & Knight LLP

(57) ABSTRACT

A storage device carrier system includes a carrier assembly configured to releasably engage a storage device and configured to be releasably received within a storage device bay within an IT component. An electrical coupler assembly is configured to electrically couple the storage device to the IT component. A thermal sealing assembly is configured to reduce the leakage of cooling air from around the storage device carrier system.

5 Claims, 8 Drawing Sheets

(56) References Cited

U.S. PATENT DOCUMENTS

2008/0049388 A1* 2/2008 Shogan ............... G06F 1/20
361/676
2015/0036287 A1* 2/2015 Ross .................. G06F 1/20
361/679.48
2015/0124397 A1* 5/2015 Dean ................. H05K 7/20145
361/679.46

* cited by examiner

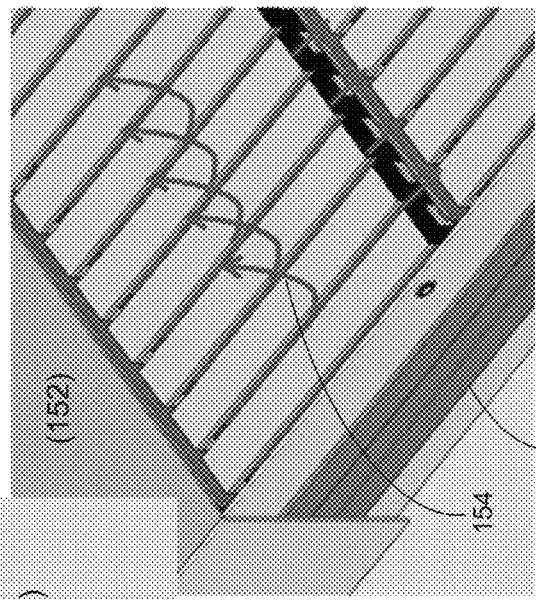
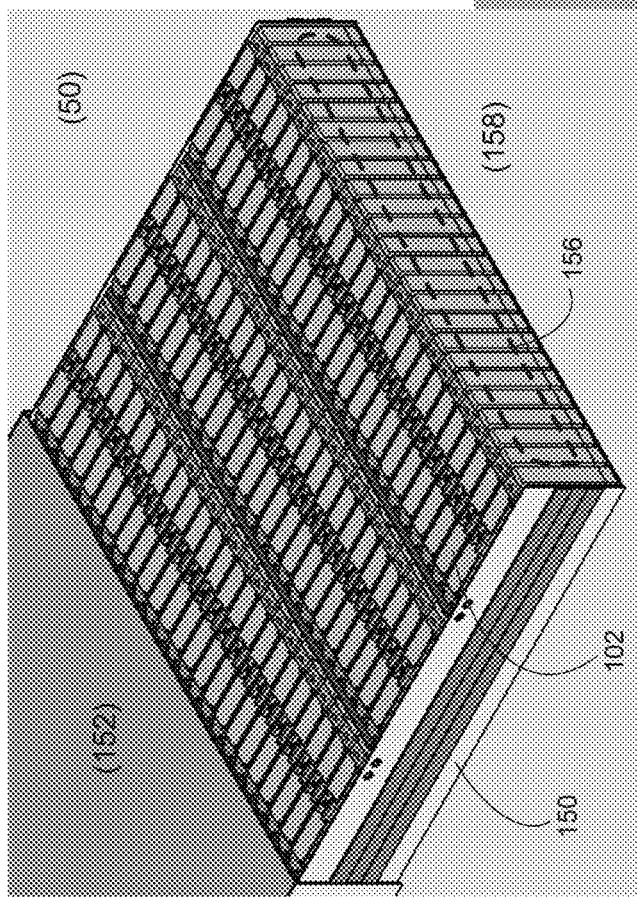
FIG. 4A
FIG. 4B

STORAGE DEVICE CARRIER SYSTEM

RELATED APPLICATION

The subject application claims the priority of China Patent Application No. 201710624429.1, filed on 27 Jul. 2017, the contents of which are herein incorporated by reference in its entirety.

TECHNICAL FIELD

This disclosure relates to storage device carriers and, more particularly, to storage device carriers that provide enhanced cooling.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, the various IT components mounted within IT racks consume considerable power and, therefore, produce considerable heat. Accordingly, these various IT components need to be provided with ample cooling in order to avoid heat-related failures.

SUMMARY OF DISCLOSURE

In one implementation, a storage device carrier system includes a carrier assembly configured to releasably engage a storage device and configured to be releasably received within a storage device bay within an IT component. An electrical coupler assembly is configured to electrically couple the storage device to the IT component. A thermal sealing assembly is configured to reduce the leakage of cooling air from around the storage device carrier system.

One or more of the following features may be included. A latch assembly may be configured to releasably lock the storage device carrier system within the storage device bay of the IT component. The thermal sealing assembly may be configured to seal a fixed width air gap. The thermal sealing assembly may be configured to seal at least a portion of an air gap between the storage device carrier system and an adjacent storage device carrier system within the IT component. The thermal sealing assembly may include a first fixed-position fin assembly configured to extend a first longitudinal edge of the storage device carrier system. The thermal sealing assembly may include a second fixed-position fin assembly configured to extend a second longitudinal edge of the storage device carrier system. The thermal sealing assembly may be configured to seal a variable width air gap. The thermal sealing assembly may be configured to seal at least a portion of an adjacent empty storage device bay within the IT component. The thermal sealing assembly may include a first multi-position fin assembly configured to extend a first longitudinal edge of the storage device carrier system. The thermal sealing assembly may include a first fin latch assembly configured to releasably lock the first multi-position fin assembly in one or more positions. The thermal sealing assembly may include a second multi-position fin assembly configured to extend a second longitudinal edge of the storage device carrier system. The thermal sealing assembly may include a second fin latch assembly configured to releasably lock the second multi-position fin assembly in one or more positions. The storage device may be a solid state storage device. The storage device may be an electro-mechanical storage device.

In another implementation, a storage device carrier system includes a carrier assembly configured to releasably engage a storage device and configured to be releasably received within a storage device bay within an IT component. An electrical coupler assembly is configured to electrically couple the storage device to the IT component. A thermal sealing assembly is configured to reduce the leakage of cooling air from around the storage device carrier system. The thermal sealing assembly includes: a first fixed-position fin assembly configured to extend a first longitudinal edge of the storage device carrier system, and a second fixed-position fin assembly configured to extend a second longitudinal edge of the storage device carrier system.

One or more of the following features may be included. The thermal sealing assembly may be configured to seal a fixed width air gap. The thermal sealing assembly may be configured to seal at least a portion of an air gap between the storage device carrier system and an adjacent storage device carrier system within the IT component.

In another implementation, a storage device carrier system includes a carrier assembly configured to releasably engage a storage device and configured to be releasably received within a storage device bay within an IT component. An electrical coupler assembly is configured to electrically couple the storage device to the IT component. A thermal sealing assembly is configured to reduce the leakage of cooling air from around the storage device carrier system. The thermal sealing assembly includes: a first multi-position fin assembly configured to extend a first longitudinal edge of the storage device carrier system, and a second multi-position fin assembly configured to extend a second longitudinal edge of the storage device carrier system.

One or more of the following features may be included. The thermal sealing assembly may be configured to seal a variable width air gap. The thermal sealing assembly may be configured to seal at least a portion of an adjacent empty storage device bay within the IT component.

The details of one or more implementations are set forth in the accompanying drawings and the description below. Other features and advantages will become apparent from the description, the drawings, and the claims.

BRIEF DESCRIPTION OF THE DRAWINGS

FIG. 2A is a front view of the rack-mountable computing device of FIG. 2;

FIGS. 4A-4B are diagrammatic views of the rack-mountable computing device of FIG. 2;

Like reference symbols in the various drawings indicate like elements.

DETAILED DESCRIPTION OF THE PREFERRED EMBODIMENTS

Figure 1:
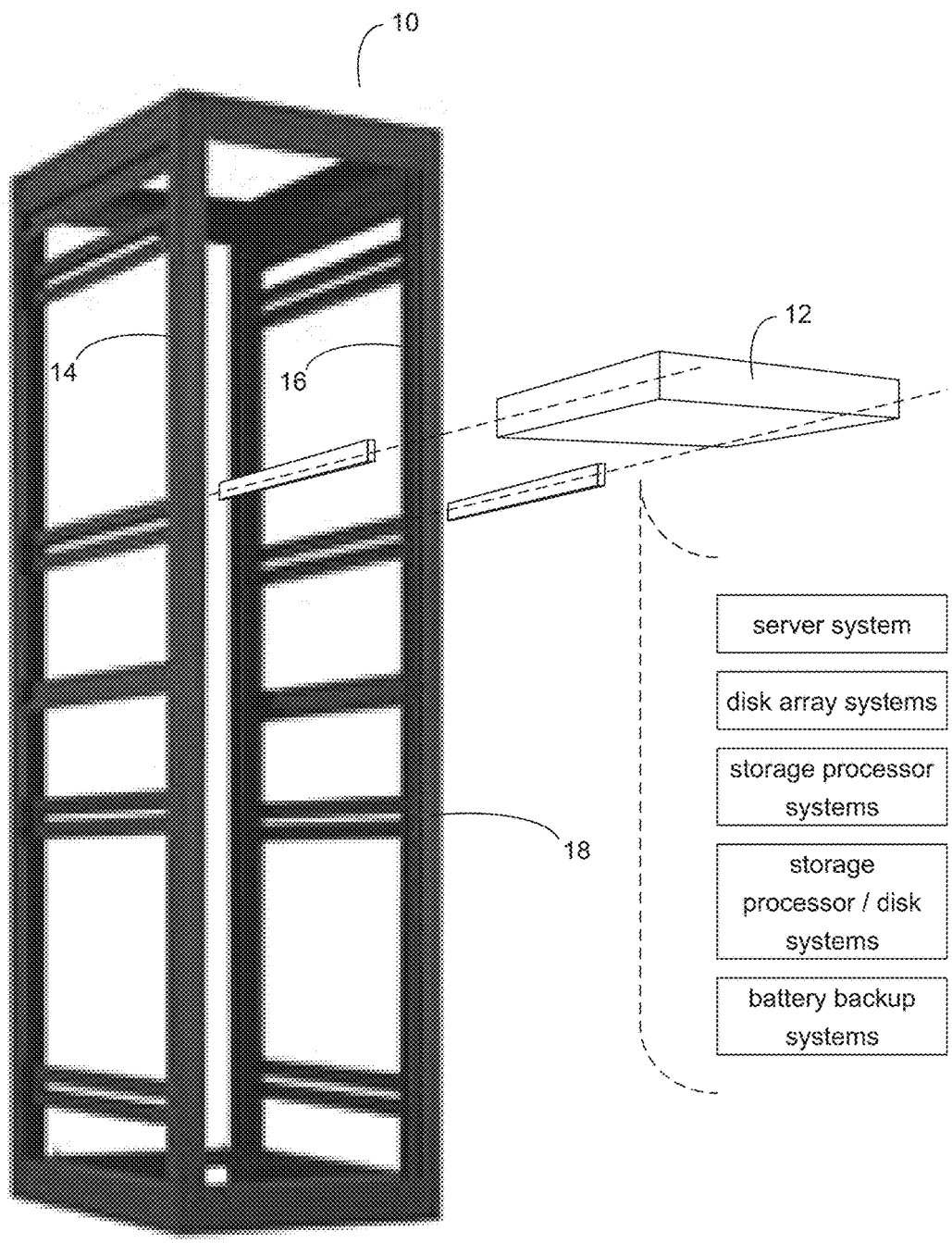
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT components that fit within a first IT rack may also fit within a second IT rack.

Typically, IT racks are defined in accordance with the number of rack units (U's) included within the rack. For example, a 1 U IT component is half as high as a 2 U IT component, which is half as high as a 4 U IT component. Accordingly, while the number of rack units available within a particular IT rack may be rigidly defined by the size of the IT rack, the number of IT components mountable within that IT rack may vary depending upon the size (in rack units) of the particular IT components being mounted within that IT rack. Therefore, by reducing the number of rack units that a particular IT component uses within an IT rack, additional IT computing devices may be mounted within the IT rack.

Figure 2:
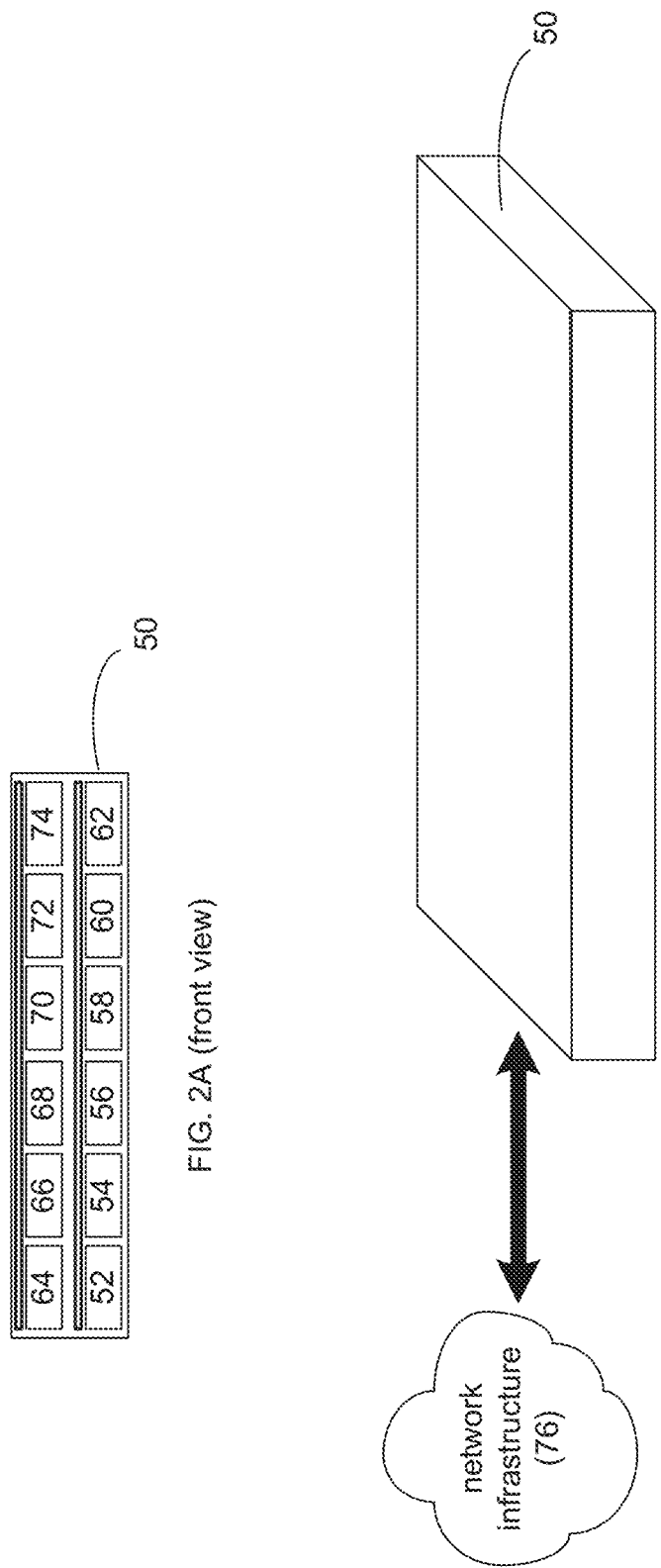
FIG. 2 is a diagrammatic view of a rack-mountable computing device for use within the IT rack of FIG. 1.

Referring to FIG. 2, there is shown one example of IT component 12, namely rack-mountable computing device 50. In this particular embodiment, rack-mountable computing device 50 may include a plurality of individual components, examples of which may include but are not limited to storage components, input/output components, and processing components, any of which may be a field replaceable unit (FRU) that is serviceable in the field.

Storage components may be the portion of rack-mountable computing device 50 that is configured to store data. Examples of such data may include but are not limited to data that is generated remotely (e.g., by applications that are executed on remote devices) or data that is generated locally (e.g., by applications that are executed on rack-mountable computing device 50). Accordingly, the storage component may be configured to include one or more storage devices, examples of which may include but are not limited to one or more electro-mechanical (e.g., rotating-media) storage devices (e.g., SATA drives or SCSI drives) and/or one or more solid state storage devices (e.g., flash drives). For example and as shown in FIG. 2A, the storage component of rack-mountable computing device 50 may be configured to include (in this example) twelve 2.5 inch form factor storage devices (e.g., storage devices 52, 54, 56, 58, 60, 62, 64, 66, 68, 70, 72, 74) that are accessible through the front panel of rack-mountable computing device 50.

Input/output components of rack-mountable computing device 50 may be the portion of rack-mountable computing device 50 that is configured to couple rack-mountable computing device 50 to a network infrastructure (e.g., network infrastructure 76), wherein network infrastructure 76 may be configured to couple rack-mountable computing device 50 to other rack-mountable computing devices, other IT components (e.g., server systems, disk array systems, storage processor systems, storage processor/disk systems, and battery backup systems), other networking devices (e.g., switches, routers, bridges, wireless access points), and/or end user computing devices (e.g., desktop computers, laptop computers, notebook computers, smartphones, tablet computers, etc.). Examples of network infrastructure 76 may include but are not limited to an Ethernet infrastructure; a fiber channel infrastructure; and an infiniband infrastructure.

Processing components of rack-mountable computing device 50 may be the portion of rack-mountable computing device 50 that is configured to process data, such as data that is generated remotely (e.g., by applications that are executed on remote devices) or data that is generated locally (e.g., by applications that are executed on rack-mountable computing device 50). Accordingly, the processing components of rack-mountable computing device 50 may be configured to include one or more microprocessors.

As the capabilities of rack-mountable computing device 50 continue to increase, the power consumption of rack-mountable computing device 50 may also continue to increase. And, therefore, the heat generated by rack-mountable computing device 50 may also continue to increase. Accordingly, enhanced methods of cooling rack-mountable computing device 50 may be needed to avoid heat-related component failure.

Figure 3:
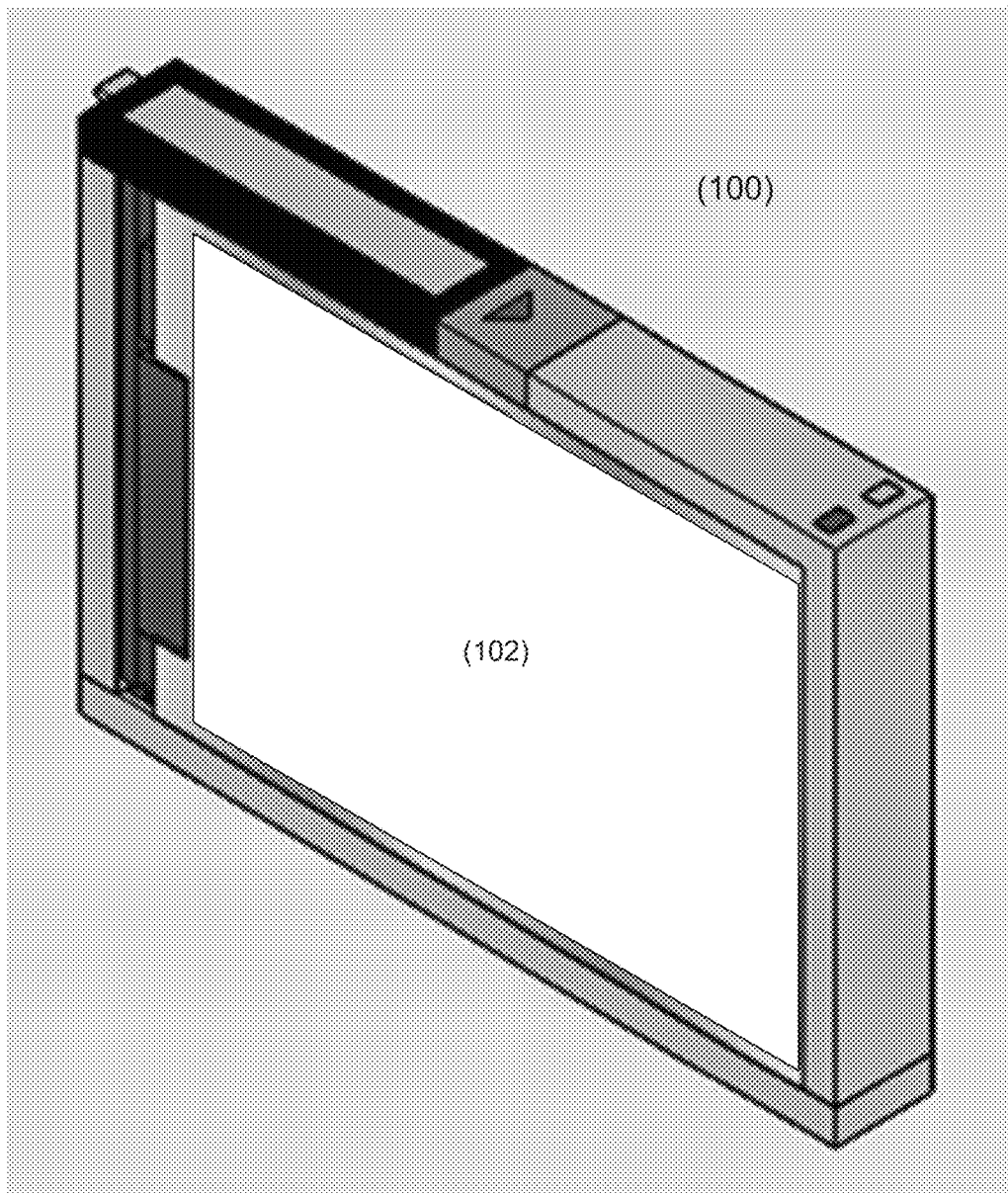
FIG. 3 is a diagrammatic view of a storage device carrier system for use within the rack-mountable computing device of FIG. 2.

Referring also to FIG. 3, there is shown storage device carrier system 100. Storage device carrier system 100 may be configured to removeably secure a storage device (e.g., storage device 102) within an enclosure assembly. Example of such an enclosure assembly may include but are not limited to a chassis, a sub-chassis, an enclosure, and a sub-enclosure (or portion thereof) of rack-mountable computing device 50. Examples of storage device 102 may include but are not limited to solid state storage devices and/or electro-mechanical storage devices (e.g., one or more of storage devices 52, 54, 56, 58, 60, 62, 64, 66, 68, 70, 72, 74).

Accordingly and through the use of storage device carrier system 100, rack-mountable computing device 50 may be configured to be easily serviceable in the field by service technicians. Specifically, storage devices (e.g., storage device 102) may be easily removed from and/or installed into rack-mountable computing device 50 without requiring the use of tools.

While the following discussion concerns storage device carrier system 100 being utilized within rack-mountable computing device 50, this is for illustrative purposes only and is not intended to be a limitation of this disclosure, as other configurations are possible and are considered to be within the scope of this disclosure. For example, storage device carrier system 100 may be utilized within commercial-grade, non-rack-mountable computing devices or consumer-grade computing devices.

Referring also to FIGS. 4A-4B, the storage devices within (in this example) rack-mountable computing device 50 may be densely packaged. For example, rack-mountable computing device 50 is shown in this implementation to include seventy-two storage devices (i.e., three rows of twenty-four storage devices). Since some solid state storage devices may dissipate up to 25 watts of thermal energy each, the system shown in FIG. 4A (which includes seventy-two storage devices) may generate up to 1,800 watts of thermal energy that will need to be dissipated in order to avoid thermal failure.

Accordingly, rack-mountable computing device 50 may be configured to provide cooling air that passes across the surfaces of (in this example) these seventy-two storage devices. As discussed above, rack-mountable computing device 50 may be configured to be easily serviceable in the field by service technicians, wherein one or more of these seventy-two storage devices (e.g., storage device 102) may be easily removed from and/or installed into rack-mountable computing device 50 without requiring the use of tools. Further and since rack-mountable computing device 50 may be configured for high availability, one or more of these seventy-two storage devices (e.g., storage device 102) may be easily removed from and/or installed into rack-mountable computing device 50 without requiring rack-mountable computing device 50 to be powered down.

Unfortunately and when the portion (e.g., drawer 150) of rack-mountable computing device 50 that contains (in this example) the seventy-two storage devices is slid out of chassis 152 of rack-mountable computing device 50 (in a fashion similar to a drawer sliding out of a piece of furniture), cooling air intended to be circulated around the storage devices may bleed out upward from the gaps between the storage devices (as represented by air bleed arrows 154) instead of passing through the entirety of rack-mountable computing device 50 and out of exhaust port 156 proximate front surface 158 of rack-mountable computing device 50. This may result in uneven cooling and/or overheating of one or more of (in this example) the seventy-two storage devices.

For example, if one or more cooling fans (not shown) are positioned at the rear of rack-mountable computing device 50 and provide positive air flow toward the front of rack-mountable computing device 50, when drawer 150 is slid out of chassis 152, cooling air may bleed out upward from the gaps between the storage devices (as represented by air bleed arrows 154), resulting in very little (if any) cooling air passing by the row of twenty-four storage devices positioned proximate front surface 158 of rack-mountable computing device 50. And this situation may result in these twenty-four storage devices not being properly cooled and possibly overheating and/or failing.

Figure 5:
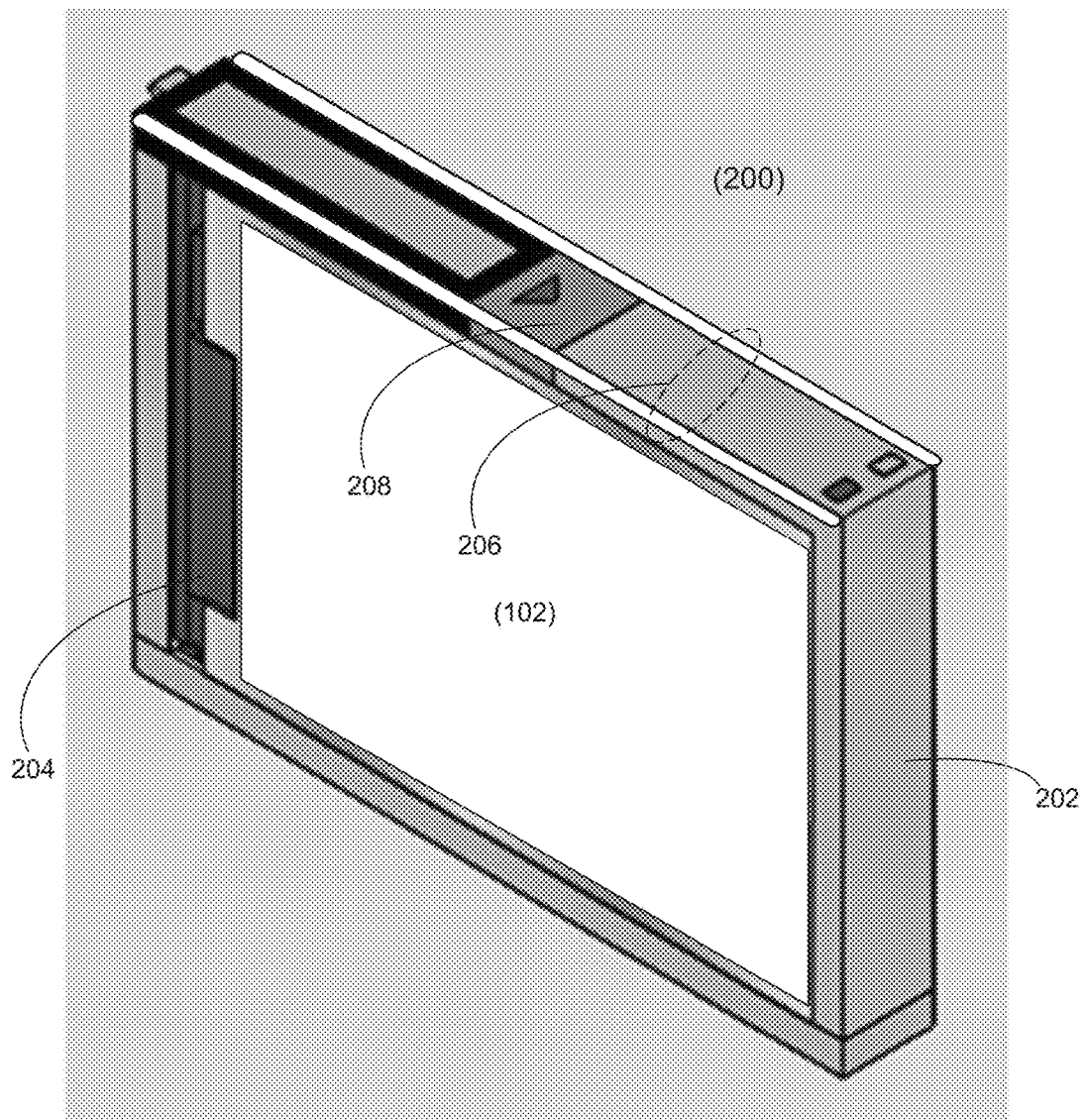
FIG. 5 is a diagrammatic views of a storage device carrier system (including a thermal sealing assembly) for use within the rack-mountable computing device of FIG. 2.

Referring also to FIG. 5, there is shown a general implementation of a storage device carrier system that is configured to reduce/eliminate the bleeding of cooling air upward from the gaps between the storage devices (as represented by air bleed arrows 154, FIG. 4B). Accordingly, storage device carrier system 200 may include carrier assembly 202 configured to releasably engage a storage device (e.g., storage device 102) and configured to be releasably received within a storage device bay within an IT component (e.g., rack-mountable computing device 50). As discussed above, examples of storage device 102 may include but are not limited to solid state storage devices and/or electro-mechanical storage devices (e.g., one or more of storage devices 52, 54, 56, 58, 60, 62, 64, 66, 68, 70, 72, 74).

Storage device carrier system 200 may include electrical coupler assembly 204 that may be configured to electrically couple storage device 102 to the IT component (e.g., rack-mountable computing device 50). For example, coupler assembly 204 may include a first electrical connector for releasably coupling storage device 102 to storage device carrier system 200 and a second electrical connector for releasably coupling storage device carrier system 200 to a system board (not shown) included within the IT component (e.g., rack-mountable computing device 50), thus allowing storage device carrier system 200 to be easily removed from (and/or inserted into) the IT component (e.g., rack-mountable computing device 50) in the event that e.g., storage device 102 needs to be replaced.

As will be explained below in greater detail, storage device carrier system 200 may include thermal sealing assembly 206 that may be configured to reduce the leakage of cooling air from around storage device carrier system 200. Storage device carrier system 200 may also include latch assembly 208 that may be configured to releasably lock storage device carrier system 200 within a storage device bay of the IT component (e.g., rack-mountable computing device 50).

Fixed-Position Fin Storage Device Carrier System

Figure 6A:
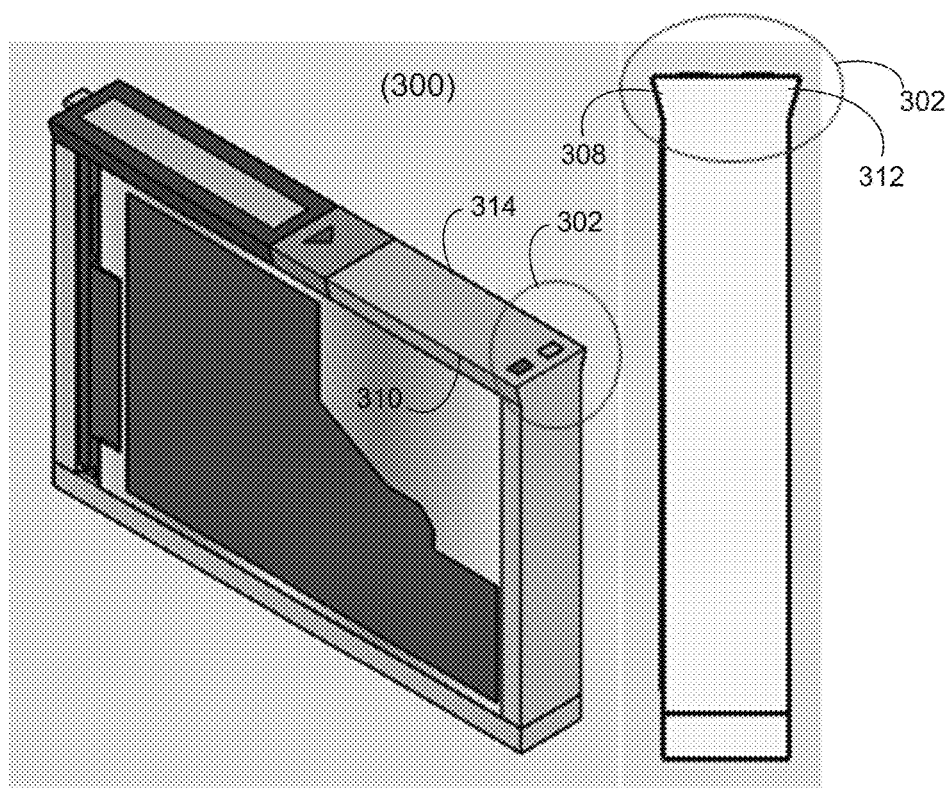
FIGS. 6A-6C are diagrammatic views of one implementation of the storage device carrier system of FIG. 5.
Figure 6B:
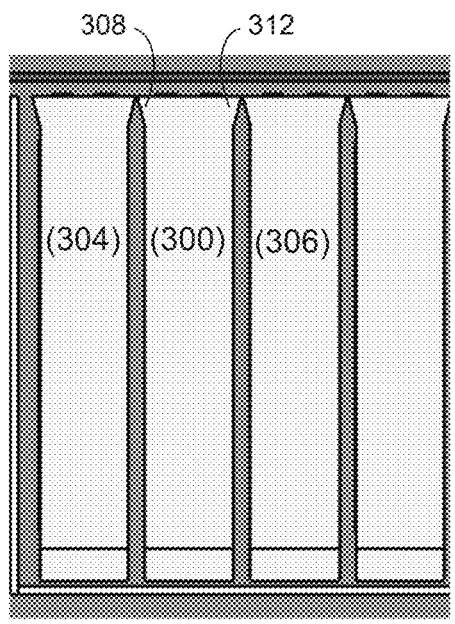
Figure 6C:
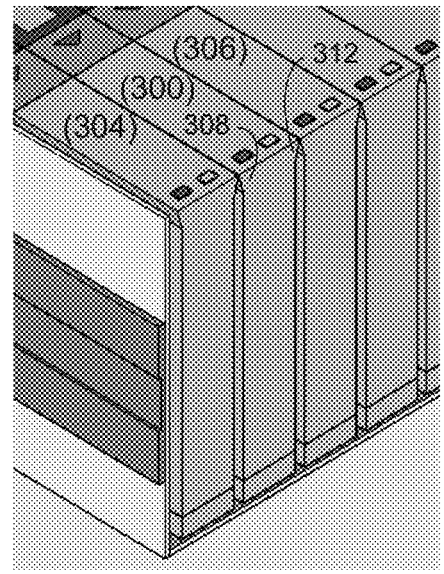

Referring also to FIGS. 6A-6C, there is shown one specific implementation of storage device carrier system 200 (namely storage device carrier system 300) in which thermal sealing assembly 302 is configured to seal a fixed width air gap. For example, thermal sealing assembly 302 may be configured to seal at least a portion of the air gap between (in this example) storage device carrier system 300 and an adjacent storage device carrier system (e.g., storage device carrier system 304 and/or storage device carrier system 306) within the IT component (e.g., rack-mountable computing device 50).

Specifically and in this implementation, thermal sealing assembly 302 may include a first fixed-position fin assembly (e.g., fixed-position fin assembly 308) configured to extend a first longitudinal edge (e.g., longitudinal edge 310) of storage device carrier system 300. Additionally, thermal sealing assembly 302 may include a second fixed-position fin assembly (e.g., fixed-position fin assembly 312) configured to extend a second longitudinal edge (e.g., longitudinal edge 314) of the storage device carrier system 300. Accordingly, the combination of fixed-position fin assemblies 308, 312 may effectively close the air gaps through which the bleeding of cooling air occurs (as represented by air bleed arrows 154, FIG. 4B).

Multi-Position Fin Storage Device Carrier System

Figure 7:
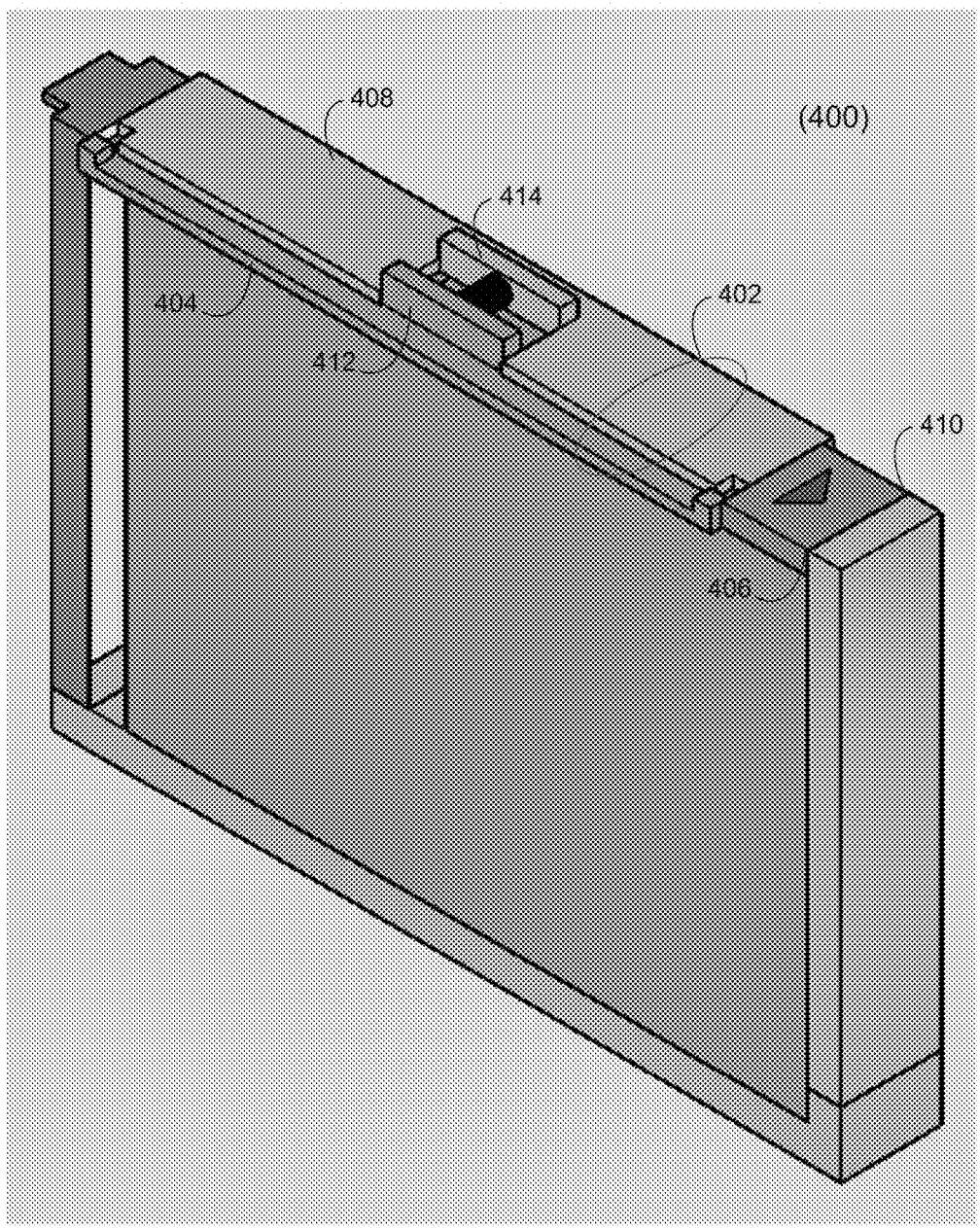
FIGS. 7, 8A-8B and 9A-9B are diagrammatic views of another implementation of the storage device carrier system of FIG. 5.

Referring also to FIG. 7, there is shown one specific implementation of storage device carrier system 200 (namely storage device carrier system 400) in which thermal sealing assembly 402 is configured to seal a variable width air gap. Thermal sealing assembly 402 may include first multi-position fin assembly 404 configured to extend first longitudinal edge 406 of storage device carrier system 400. Additionally, thermal sealing assembly 402 may include second multi-position fin assembly 408 configured to extend second longitudinal edge 410 of storage device carrier system 400.

As will be discussed below, first multi-position fin assembly 404 and second multi-position fin assembly 408 may be configured to be locked in various positions. Accordingly, thermal sealing assembly 402 may include first fin latch assembly 412 configured to releasably lock first multi-position fin assembly 404 in one or more positions. Additionally, thermal sealing assembly 402 may include second fin latch assembly 414 configured to releasably lock second multi-position fin assembly 408 in one or more positions.

Figure 8A:
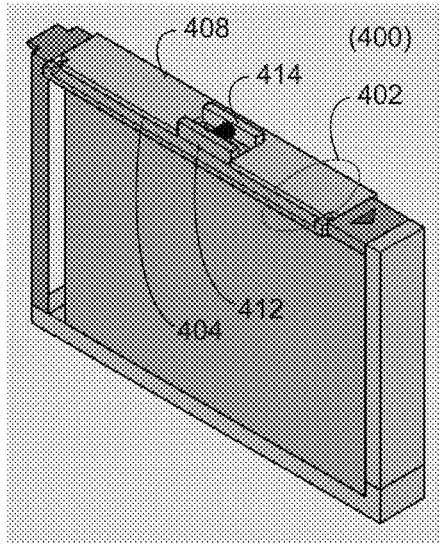
Figure 8B:
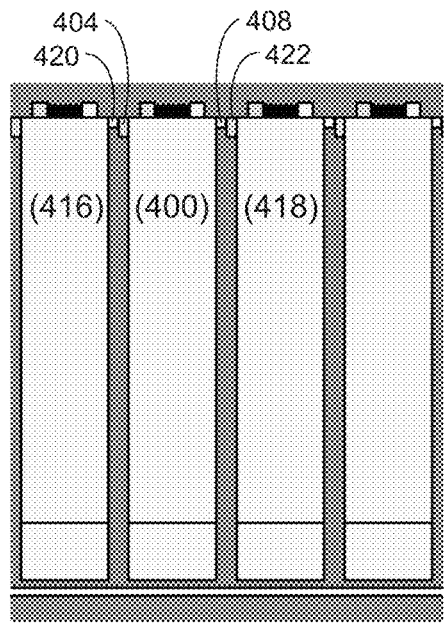

Referring also to FIGS. 8A-8B, thermal sealing assembly 402 may be configured to seal at least a portion of the air gap between (in this example) storage device carrier system 400 and an adjacent storage device carrier system (e.g., storage device carrier system 416 and/or storage device carrier system 418) within the IT component (e.g., rack-mountable computing device 50). For example, first multi-position fin assembly 404 may be unlocked (via first fin latch assembly 412) and extended outward to contact second fin assembly 420 of storage device carrier system 416; and second multi-position fin assembly 408 may be unlocked (via second fin latch assembly 414) and extended outward to contact first multi-position fin assembly 404 of storage device carrier system 418. Accordingly, the combination of multi-position fin assemblies 404, 408 may effectively close the air gaps through which the bleeding of cooling air occurs (as represented by air bleed arrows 154, FIG. 4B).

Figure 9A:
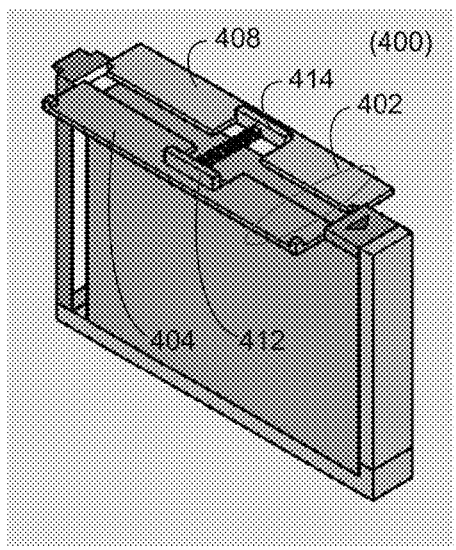
Figure 9B:
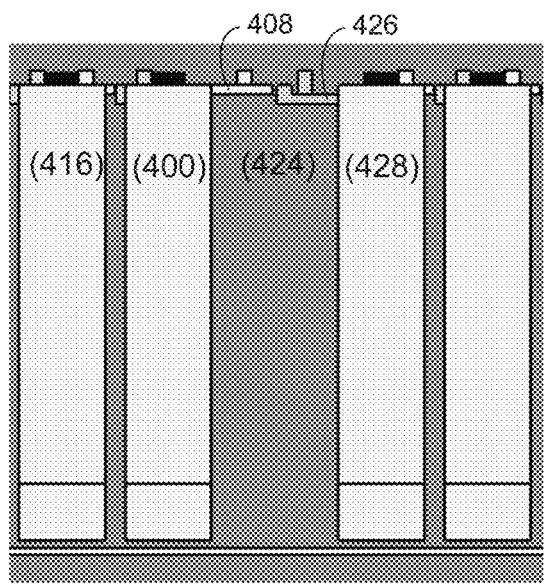

Additionally and referring also to FIGS. 9A-9B, thermal sealing assembly 402 may be configured to seal at least a portion of an adjacent empty storage device bay (e.g., empty storage bay 424) within the IT component (e.g., rack-mountable computing device 50). For example, second multi-position fin assembly 408 may be unlocked (via second fin latch assembly 414) and extended outward to contact first multi-position fin assembly 426 of storage device carrier system 428. Accordingly, the combination of multi-position fin assemblies 408, 426 may effectively close the air gap caused by empty storage bay 424 through which the bleeding of cooling air occurs (as represented by air bleed arrows 154, FIG. 4B).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A storage device carrier system comprising:
   a carrier assembly configured to releasably engage a storage device and configured to be releasably received within a storage device bay within an IT component;
   an electrical coupler assembly configured to electrically couple the storage device to the IT component; and
   a thermal sealing assembly configured to reduce the leakage of cooling air from around the storage device carrier system, wherein the thermal sealing assembly includes:
   a first multi-position fin assembly that adjustably extends, via a first fin latch, a first longitudinal edge of the storage device carrier system, and
   a second multi-position fin assembly that adjustably extends, via a second fin latch, a second longitudinal edge of the storage device carrier system, wherein the first multi-position fin assembly and the second multi-position fin assembly outwardly extend from their respective fin latch to make contact, wherein the contact between the first multi-position fin assembly and the second multi-position fin assembly effectively closes the variable width air gap around the storage device carrier system through which the leakage of cooling air occurs.

2. The storage device carrier system of claim 1 wherein the thermal sealing assembly is configured to seal a variable width air gap.

3. The storage device carrier system of claim 2 wherein the thermal sealing assembly is configured to seal at least a portion of an adjacent empty storage device bay within the IT component.

4. The storage device carrier system of claim 1 wherein the first fin latch is configured to releasably lock the first multi-position fin assembly in one or more positions.

5. The storage device carrier system of claim 1 wherein the second fin latch is configured to releasably lock the second multi-position fin assembly in one or more positions.

* * * * *